(12) United States Patent
Guo

(10) Patent No.: US 9,362,489 B1
(45) Date of Patent: Jun. 7, 2016

(54) METHOD OF MAKING A MAGNETORESISTIVE ELEMENT

(71) Applicant: Yimin Guo, San Jose, CA (US)

(72) Inventor: Yimin Guo, San Jose, CA (US)

( * ) Notice: Subject to any disclaimer, the term of this patent is extended or adjusted under 35 U.S.C. 154(b) by 0 days.

(21) Appl. No.: 14/695,286

(22) Filed: Apr. 24, 2015

(51) Int. Cl.
*H01L 43/02* (2006.01)
*H01L 43/12* (2006.01)

(52) U.S. Cl.
CPC ........................................ *H01L 43/12* (2013.01)

(58) Field of Classification Search
CPC ...... H01L 43/02; H01L 27/222; H01L 27/224
See application file for complete search history.

(56) References Cited

U.S. PATENT DOCUMENTS

| | | | | |
|---|---|---|---|---|
| 2009/0080239 A1* | 3/2009 | Nagase | ................. | H01L 27/228 365/158 |
| 2014/0103469 A1* | 4/2014 | Jan | ........................ | H01L 43/10 257/421 |
| 2014/0175428 A1* | 6/2014 | Guo | ........................ | H01L 43/10 257/43 |
| 2014/0175581 A1* | 6/2014 | Guo | ........................ | H01L 43/12 257/421 |
| 2014/0197504 A1* | 7/2014 | Moriyama | ........... | G11C 11/161 257/421 |
| 2014/0210025 A1* | 7/2014 | Guo | ........................ | A63F 13/10 257/421 |
| 2014/0217526 A1* | 8/2014 | Guo | ........................ | H01L 43/08 257/421 |
| 2014/0264673 A1* | 9/2014 | Kitagawa | ................ | H01L 43/10 257/421 |

* cited by examiner

*Primary Examiner* — Mamadou Diallo
(74) *Attorney, Agent, or Firm* — Chein-Hwa Tsao; Lance A. Li; Yuanhui Huang

(57) ABSTRACT

A method of making a magnetoresistive element comprises making a crystalline structural quality and magnetic anisotropy enhancement bilayer (CSMAE bilayer) thus a). enhancing the crystalline structural quality, hence fabrication yield, of the resulting magnetoresistive element; and b). enhancing the magnetic anisotropy of the recording layer whereby achieving a high MR ratio for the magnetoresistive element with a simultaneous reduction of an undesirable spin pumping effect. As the magnetoresistive film is thermally annealed, a crystallization process occurs to form bcc CoFe grains having epitaxial growth with (100) plane parallel to the surface of the tunnel barrier layer as Boron elements migrate into the impurity absorbing layer. Removing the top portion of the impurity absorbing layer by means of sputtering etch or RIE etch processes followed by optional oxidization process, a thin but thermally stable portion of impurity absorbing layer is formed on top of the magnetoresistive element with a low damping constant. Accordingly, a reduced write current can be achieved for spin-transfer torque MRAM application.

20 Claims, 2 Drawing Sheets

Present Invention

Present Invention

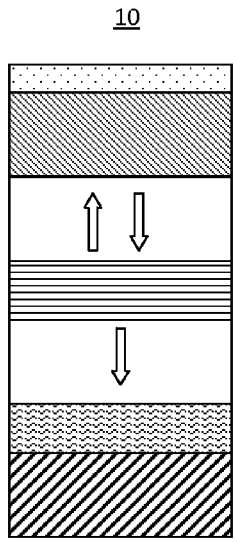
FIG. 1A: Present Invention
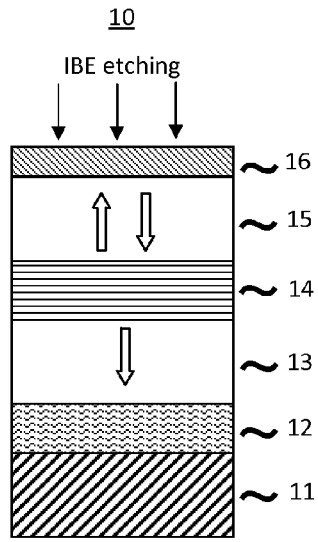
FIG. 1B: Present Invention
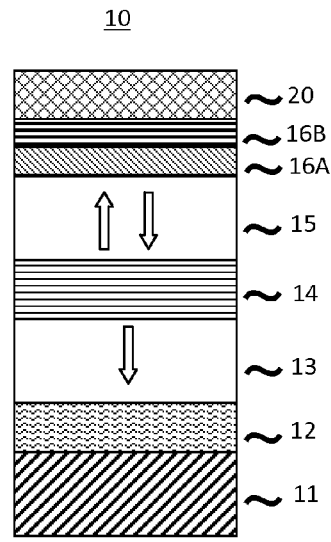
FIG. 2: Present Invent
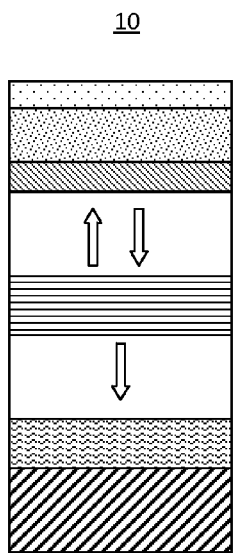
FIG. 3A: Present Invention
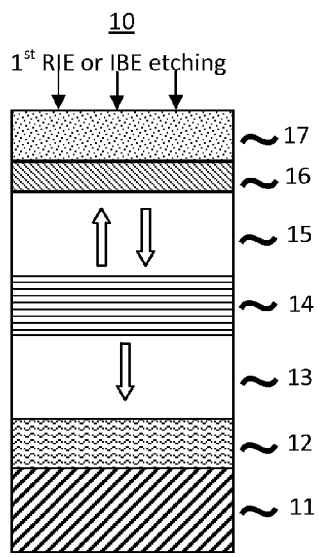
FIG. 3B: Present Invention
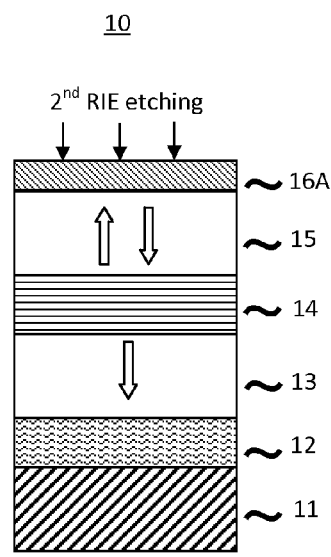
FIG. 3C: Present Invention

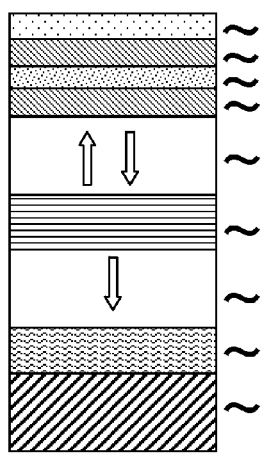 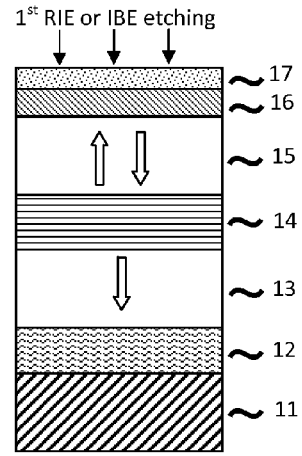 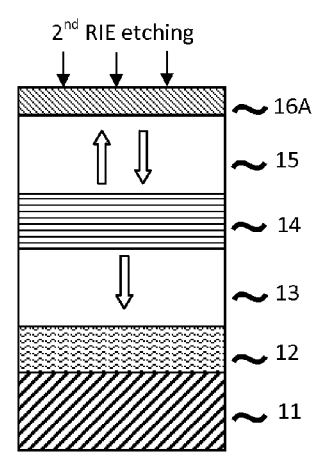
FIG. 4A: Present Invention  FIG. 4B: Present Invention  FIG. 4C: Present Invention
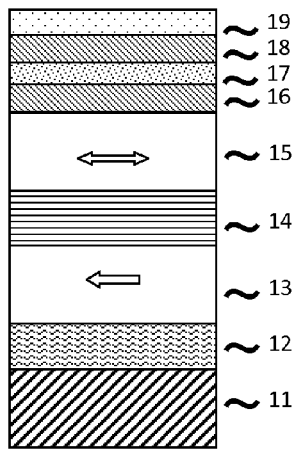 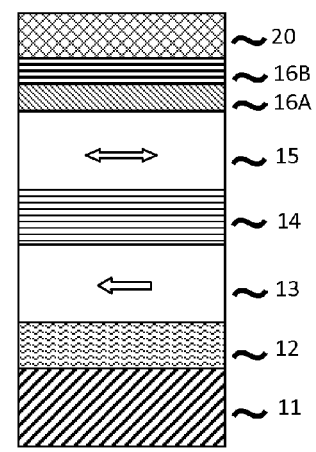
FIG. 5: Present Invention  FIG. 6: Present Invention

METHOD OF MAKING A MAGNETORESISTIVE ELEMENT

RELATED APPLICATIONS

This application is a divisional application due to a restriction requirement on application Ser. No. 14/073,844. This application seeks priority to U.S. Utility patent application Ser. No. 14/073,844 filed on Nov. 6, 2013 and U.S. Provisional Patent Application No. 61/745,757, filed on Dec. 24, 2012; the entire contents of each of which are incorporated herein by reference.

BACKGROUND OF THE INVENTION

1. Field of the Invention

This invention relates to the field of magnetoresistive elements. More specifically, the invention comprises spin-transfer-torque magnetic-random-access memory (MRAM) using magnetoresistive elements as basic memory cells which potentially replace the conventional semiconductor memory used in electronic chips, especially mobile chips for power saving and non-volatility.

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can cope with high-speed reading and writing, large capacities, and low-power-consumption operations. A ferromagnetic tunnel junction has a three-layer stack structure formed by stacking a recording layer having a changeable magnetization direction, an insulating spacing layer, and a fixed reference layer that is located on the opposite side from the recording layer and maintains a predetermined magnetization direction.

As a write method to be used in such magnetoresistive elements, there has been suggested a write method (spin torque transfer switching technique) using spin momentum transfers. According to this method, the magnetization direction of a recording layer is reversed by applying a spin-polarized current to the magnetoresistive element. Furthermore, as the volume of the magnetic layer forming the recording layer is smaller, the injected spin-polarized current to write or switch can be also smaller. Accordingly, this method is expected to be a write method that can achieve both device miniaturization and lower currents.

Further, as in a so-called perpendicular MTJ element (equivalently referred to as the "magnetoresistive element"), both two magnetization films have easy axis of magnetization in a direction perpendicular to the film plane due to their strong magnetic crystalline anisotropy (shape anisotropies are not used), and accordingly, the device shape can be made smaller than that of an in-plane magnetization type. Also, variance in the easy axis of magnetization can be made smaller. Accordingly, by using a material having a large perpendicular magnetic crystalline anisotropy, both miniaturization and lower currents can be expected to be achieved while a thermal disturbance resistance is maintained.

There has been a known technique for achieving a high MR ratio in a perpendicular MTJ element by forming an underneath MgO tunnel barrier layer and a bcc or hcp-phase cap layer that sandwich a thin recoding layer having an amorphous CoFeB ferromagnetic film and accelerate crystallization of the amorphous ferromagnetic film to match interfacial grain structure to MgO layer through a thermal annealing process. The recording layer crystallization starts from the tunnel barrier layer side to the cap layer and forms a CoFe grain structure having a perpendicular magnetic anisotropy, as Boron elements migrate into the cap layer. Accordingly, a coherent perpendicular magnetic tunneling junction structure is formed. By using this technique, a high MR ratio can be achieved.

However, where a cap layer is used for achieving a high MR ratio in an MTJ element, the cap layer may increase the damping constant of the recording layer, due to the so-called spin-pumping effect. Further, the damping constant of the recording layer may also increase from the additional cap layer material diffusion during the heat treatment in the device manufacturing process.

In a spin-injection MRAM using either a perpendicular or planar magnetization film, a write current is proportional to the damping constant and inversely proportional to a spin polarization. Therefore, reduction of the damping constant and increase of the spin polarization are mandatory technologies to reduce the write current.

BRIEF SUMMARY OF THE PRESENT INVENTION

Present invention illustrates a method of making one or more perpendicular magnetoresistive elements for perpendicular spin-transfer-torque MRAM with improved quality and yield.

The method presented in present invention makes a perpendicular magnetoresistive element to be sandwiched between an upper electrode and a lower electrode of each MRAM memory cell, together with a write circuit which bi-directionally supplies a spin polarized current to the magnetoresistive element and a select transistor electrically connected between the magnetoresistive element and the write circuit.

The method of making such a perpendicular magnetoresistive element comprises: forming a reference layer having magnetic anisotropy in a direction perpendicular to a film surface of the reference layer and having an invariable magnetization direction; forming a tunnel barrier layer on the reference layer; forming a recording layer having magnetic anisotropy in a direction perpendicular to a film surface of the reference layer and having a variable magnetization direction on the tunnel barrier layer; and forming a "crystalline structural quality and magnetic anisotropy enhancement bilayer" (CSMAE bilayer) comprising a recording layer and a novel impurity absorbing layer with one or more impurity absorbing sub-layer(s) atop the recording layer. Such an impurity absorbing layer with one or more impurity absorbing sub-layer(s) may be hereafter simply, equivalently, or interchangeably named as a cap layer or a cap multilayer with one or more sub-layer(s). Then device in process is treated with a thermal annealing process. A key technique in present invention is removing at least the top portion or upper portion of the cap layer or cap multilayer (i.e. a sacrificial layer) after conducting a thermal annealing process on the magnetoresistive film but keeping the remaining portion of the cap layer atop the recording layer with a reasonable thickness that has an increased thermal stability due to annealing, whereby damping constant of the recording layer, due to the so-called spin-pumping effect, is reduced by this process of trimming the top portion of the cap layer that has absorbed significant amount of impurity Boron migrated from the recording layer.

As an amorphous ferromagnetic material, like CoFeB, in the recording layer is thermally annealed, a crystallization process occurs to form bcc CoFe grains having epitaxial growth with (100) plane parallel to the surface of the tunnel barrier layer to form a perpendicular anisotropy as Boron elements migrate into the impurity absorbing layer, i.e., cap layer or cap multilayer. In this case, the "impurity" element inside the recording layer is Boron. Removing the top portion of the cap layer by means of sputtering etching including ion bean etching (IBE) or reactive ion etching (RIE) process(es), followed by an oxidization process when necessary, a thin but thermally stable portion of the cap layer is preserved atop the recording layer. Thus a recording layer having a lower damping constant and requiring a reduced write current for writing is achieved.

The method illustrated in present invention is also suitable for making planar magnetoresistive elements also known as parallel (parallel to a film surface of the reference layer), spin-transfer-torque MRAM.

BRIEF DESCRIPTION OF THE DRAWINGS

FIG. 1A is a cross-sectional view showing a configuration of an MTJ element 10 as deposited, according to the method illustrated in first embodiment;

FIG. 1B is a cross-sectional view showing a configuration of an MTJ element 10 after IBE etching process to remove the protective layer and top portion of the impurity absorbing layer, according to the method illustrated in first embodiment;

FIG. 2 is a cross-sectional view showing a configuration of an MTJ element 10 after an optional top surface oxidization of the remaining impurity absorbing layer, followed by deposition of a upper-contact multilayer film comprising a buffer layer and a photoresist layer;

FIG. 3A is a cross-sectional view showing a configuration of an MTJ element 10 as deposited, according to the method illustrated in second embodiment;

FIG. 3B is a cross-sectional view showing a configuration of an MTJ element 10 after the $1^{st}$ RIE or IBE etching process to remove the protective layer, according to the method illustrated in second embodiment;

FIG. 3C is a cross-sectional view showing a configuration of an MTJ element 10 after the $2^{nd}$ RIE etching process to remove the second cap sub-layer (equivalently referred to as the "second impurity absorbing sub-layer"), according to the method illustrated in second embodiment;

FIG. 4A is a cross-sectional view showing a configuration of an MTJ element 10 as deposited, according to the method illustrated in third embodiment;

FIG. 4B is a cross-sectional view showing a configuration of an MTJ element 10 after the $1^{st}$ RIE or IBE etching process to remove the protective layer and the third cap sub-layer (equivalently referred to as the "third impurity absorbing sub-layer"), according to the method illustrated in third embodiment;

FIG. 4C is a cross-sectional view showing a configuration of an MTJ element 10 after the $2^{nd}$ RIE etching process to remove the second impurity absorbing sub-layer, according to the method illustrated in third embodiment;

FIG. 5 is a cross-sectional view showing a configuration of an MTJ element 10 as deposited, according to the method illustrated in fourth embodiment;

FIG. 6 is a cross-sectional view showing a configuration of an MTJ element 10 after an optional top surface oxidization of the remaining first impurity absorbing sub-layer", followed by deposition of a upper-contact layer film comprising a buffer layer and a photoresist layer, according to the method illustrated in fourth embodiment.

DETAILED DESCRIPTION OF THE INVENTION

In general, according to one embodiment in present invention, making a magnetoresistive element comprising:

forming a reference layer having magnetic anisotropy and having an invariable magnetization direction;

forming a tunnel barrier layer atop the reference layer;

forming a recording layer atop the tunnel barrier layer and having a variable magnetization direction;

forming an impurity absorbing layer, with one or more impurity sublayer(s), i.e., a cap layer or cap multilayer, atop the recording layer;

forming a protective layer atop the cap multilayer, wherein the protective layer and at least the top portion of the cap layer or cap multilayer are later removed or trimmed after conducting a thermal annealing process on the magnetoresistive film but keeping the remaining portion of the cap layer, interfacing the recording layer, with a reasonable thickness that has an increased thermal stability due to annealing;

employing an oxidization process to oxidize the top surface of the remaining cap layer when necessary; and forming an upper-contact layer provided on the remaining cap layer, comprising a buffer layer and a photoresist layer for further photo-lithographic processes of making a magnetoresistive element.

First Embodiment

FIG. 1A and FIG. 1B are cross-sectional views showing a configuration of an MTJ element 10 as deposited according to the method described in first embodiment. The MTJ element 10 is configured by stacking a bottom electrode 11, a base layer (equivalently referred to as the "seed layer") 12, a reference layer 13, a tunnel barrier layer 14, a recording layer 15, a cap layer 16, and a protective layer 17 in this order from the bottom.

The reference layer 13 and the recording layer 15 are made of a ferromagnetic material, and have uni-axial magnetic anisotropy in a direction perpendicular to the film surfaces. Further, directions of easy magnetization of the reference layer 13 and the recording layer 15 are also perpendicular to the film surfaces. In other words, the MTJ element 10 is a perpendicular MTJ element in which magnetization direction of the reference layer 13 and the recording layer 15 faces in a direction perpendicular to the film surfaces. A direction of easy magnetization is a direction in which the internal magnetic energy is at its minimum where no external magnetic field exists. Meanwhile, a direction of hard magnetization is a direction in which the internal energy is at its maximum where no external magnetic field exists.

The recording layer 15 has a variable (reversible) magnetization direction. The reference layer 13 has an invariable (fixing) magnetization direction. The reference layer 13 is made of a ferromagnetic material having a perpendicular magnetic anisotropic energy which is sufficiently greater than the recording layer 15. This strong perpendicular magnetic anisotropy can be achieved by selecting a material, configuration and a film thickness. In this manner, a spin polarized current may only reverse the magnetization direction of the recording layer 15 while the magnetization direction of the reference layer 13 remains unchanged. An MTJ element 10 which comprises a recording layer 15 having a variable magnetization direction and a reference layer 13 having an invariable magnetization direction for a predetermined write current can be achieved.

The tunnel barrier layer 14 is made of a non-magnetic insulating metal oxide or nitride.

The cap layer 16 is made of a low electro-negativity and low diffusivity metal layer or a metal alloy layer having a bcc or hcp-phase and having at least a thickness of 50 angstroms. The cap layer serves to introduce and to enhance crystalline structural quality and perpendicular magnetic anisotropy of the recording layer 15. As an amorphous ferromagnetic material, like CoFeB, in the recording layer is thermally annealed, a crystallization process occurs to form bcc CoFe grains having epitaxial growth with (100) plane parallel to surface of the tunnel barrier layer and a perpendicular anisotropy is induced in the recording layer, as Boron elements migrate into the cap layer having a low electro-negativity. A damping constant of the recording layer 15 sometimes increases (deteriorates) depending on a material in contact with the recording layer 15, which is known as a spin pumping effect. The cap layer 16 may also have a function to prevent increase of the damping constant of the recording layer 15 by reducing the spin pumping. Further, the thickness of the cap layer 16 is selected to be big enough that it serves as a good absorber for the Boron elements from the recording layer to achieve better epitaxial CoFe crystal grains in the recoding layer having an ultra-low damping constant.

An example configuration of the MTJ element 10 will be described below. The reference layer 13 is made of CoFeB (around 2 nm)/TbCoFe (around 20 nm). The tunnel barrier layer 14 is made of MgO (around 1 nm). The recording layer 15 is made of CoFeB (around 1.2 nm). The cap layer 16 is made of Ti (around 10 nm). The protective layer 17 is made of Ru (around 10 nm). The base layer 12 is made of Ta (around 20 nm)/Cu (around 20 nm)/Ta (around 20 nm). Each element written in the left side of "/" is stacked above an element written in the right side thereof.

The CoFeB (with Boron content no less than 10% and no more than 30%) layer comprised in the recording layer 15 is in an amorphous state as deposited. The MgO layer comprised in the tunnel barrier layer 14 is formed into rocksalt crystal grains with the (100) plane parallel to the substrate plane. During a thermal annealing with a temperature higher than 250-degree C, the Boron elements of the CoFeB migrate into its above Ti cap layer to form $TiB_2$ since Ti has much lower electro-negativity than Co and Fe, and the amorphous CoFeB is crystallized to form bcc CoFe grains having epitaxial growth with (100) plane parallel to the surface of the MgO crystal tunnel barrier layer. A thick Ti cap layer is essential to absorb as many as Boron atoms as possible and achieve better epitaxial bcc CoFe crystal grains. A relatively pure CoFe film has a lower damping constant than an amorphous CoFeB film. A typical damping constant for a pure CoFe is around 0.003, while CoFeB has a damping constant of 0.01. Accordingly, a perpendicular magnetization having a low damping constant is induced in the recording layer.

After the thermal annealing process, an IBE etching process is adopted to etch away the Ru protective layer and the top portion of the Ti cap layer, leaving a much thinner remaining Ti cap layer for an easy integration with very small dimension lithographic patterning process, as shown in FIG. 1B. An upper contact layer 19 (not shown) comprising a buffer layer and a photoresist layer is then deposited on the top of MTJ film after the etching.

Then, if necessary, a surface oxidization process may also be added before the upper contact layer deposition. A surface oxidization process, i.e. by using of a mixed gas containing natural oxygen ($O_2$), or radical oxygen and Argon (Ar), may also be adopted before the deposition of the upper contact layer. Doing so, a thin oxide layer 16B is formed between the remaining cap layer 16A and the upper contact layer 20 for better interfacial thermal stability and less diffusion. The final configuration of the MTJ element 10, which is ready for MTJ element photolithographic patterning process, is shown in FIG. 2.

Second Embodiment

FIG. 3A is a cross-sectional view showing an example configuration of the MTJ element 10 as deposited according to the method described in second embodiment. As shown in FIG. 3A, the reference layer 13 is made of CoFeB (around 2 nm)/TbCoFe (around 20 nm). The tunnel barrier layer 14 is made of MgO (around 1 nm). The recording layer 15 is made of CoFeB (around 1.2 nm). The first cap sub-layer (equivalently referred to as the "first impurity absorbing sub-layer") 16 is made of Ti (around 2 nm). The second cap sub-layer (equivalently referred to as the "second impurity absorbing sub-layer") 17 is made of Ta (around 10 nm). The protective layer 18 is made of Ru (around 10 nm). The base layer is made of Ta (around 20 nm)/Cu (around 20 nm)/Ta (around 20 nm). Each element written in the left side of "/" is stacked above an element written in the right side thereof.

Similar to the first embodiment, the CoFeB (with Boron content no less than 10% and no more than 30%) layer comprised in the recording layer 15 is formed into an amorphous state as deposited. During a thermal annealing with a temperature higher than 250-degree, the Boron elements of the CoFeB migrate first into its above thin Ti cap sub-layer 16 and further across Ti cap sub-layer into the Ta cap sub-layer 17, since Ta atom has a even lower electro-negativity and a stronger Boron-bonding than Ti atom. The ionicity of metal-Boron bonds decreases in the following order: Mg, Al, Mn, Y, Cr, Zr, Hf, Nb, Ta, V and Ti. Accordingly, the amorphous CoFeB in the recording layer is crystallized to form bcc CoFe grains having epitaxial growth with (100) plane parallel to surface of the MgO crystal tunnel barrier layer, and a perpendicular magnetization having a low damping constant is induced in the recording layer.

After the thermal annealing process, a RIE etching process utilizing $CH_3OH$ gas, or $NH_3+CO$ mixed gas chemistry can be employed to etch away the protective Ru layer 18 and the second cap Ta sub-layer serves as its etch-stop layer, as shown in FIG. 3B. Alternatively, an IBE etching process is utilized to etch away the protective Ru layer 18 and the upper portion of the second cap Ta sub-layer 17. The remaining Ta cap sub-layer is readily removed by the $2^{nd}$ RIE etching process utilizing $CF_4$ gas chemistry, leaving a thin Ti first cap sub-layer, as shown in FIG. 3C, for an easy integration with very small dimension lithographic patterning process. Following an optional surface oxidization process if necessary, also similar to the first embodiment, an upper contact layer 20 comprising a buffer layer and a photoresist layer is then deposited on the top of MTJ film, and the final configuration of the MTJ element 10, which is ready for MTJ element photolithographic patterning process, is shown in FIG. 2.

Third Embodiment

FIG. 3A is a cross-sectional view showing an example configuration of the MTJ element 10 as deposited according to the method described in second embodiment. As shown in FIG. 3A, the reference layer 13 is made of CoFeB (around 2 nm)/TbCoFe (around 20 nm). The tunnel barrier layer 14 is made of MgO (around 1 nm). The recording layer 15 is made of CoFeB (around 1.2 nm). The first cap sub-layer (equivalently referred to as the "first impurity absorbing sub-layer") 16 is made of Ti (around 2 nm). The second cap sub-layer (equivalently referred to as the "second impurity absorbing sub-layer") 17 is made of Ta (around 10 nm). The protective layer 18 is made of Ru (around 10 nm). The base layer is made of Ta (around 20 nm)/Cu (around 20 nm)/Ta (around 20 nm).

Each element written in the left side of "/" is stacked above an element written in the right side thereof.

Similar to the first and second embodiments, the CoFeB (with Boron content no less than 10% and no more than 30%) layer comprised in the recording layer 15 is formed into an amorphous state as deposited. During a thermal annealing with a temperature higher than 250-degree, the Boron elements of the CoFeB migrate first into its above thin Ti cap sub-layer 16 and thin Ta cap sub-layer 17, and further across them into the Hf cap sub-layer 18, since Hf atom has a even lower electro-negativity and a stronger Boron-bond than both of Ti atom and Ta atom. From the first cap sub-layer to the third cap sub-layer, the bond iconicity with Boron atom gradually increases and more effectively attracts or absorbs Boron elements from the CoFeB recording layer. Accordingly, the amorphous CoFeB in the recording layer is crystallized to form better bcc CoFe grains having epitaxial growth with (100) plane parallel to surface of the MgO crystal tunnel barrier layer, and a perpendicular magnetization having a low damping constant is induced in the recording layer.

After the thermal annealing process, the $1^{st}$ RIE etching process using CH3OH gas, or NH3+Co mixed gas chemistry is employed to etch away the protective Ru layer 19 and the third cap Hf sub-layer 18, stopping at Ta cap sub-layer 17, as shown in FIG. 4B. The remaining Ta cap sub-layer is then readily removed by the $2^{nd}$ RIE etching process using CF4 gas chemistry, leaving a thin Ti first cap sub-layer, as shown in FIG. 4C, for an easy integration with very small dimension lithographic patterning process. Following an optional surface oxidization process, also similar to the first embodiment, an upper contact layer 20 comprising a buffer layer and a photoresist layer is then deposited on the top of MTJ film, and the final configuration of the MTJ element 10, which is ready for MTJ element photolithographic patterning process, is shown in FIG. 2.

Fourth Embodiment

Similar to above embodiments, the same cap multilayer can be adopted in a planar magnetoresistive element. FIG. 5 is a cross-sectional view showing an example configuration of the MTJ element 10 according to the method described in fourth embodiment. All layered configuration can be identical to those of the third embodiment, except that the reference layer has an invariable magnetization in a direction parallel to a film surface and the recording layer has a variable magnetization in a direction parallel to a film surface. After the same thermal annealing and etching processes are utilized, the final configuration of the MTJ element 10, which is ready for MTJ element photolithographic patterning process, is shown in FIG. 6.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A method of fabricating a magnetoresistive element comprises:
   providing a seed layer;
   forming a reference layer, atop the seed layer, having a magnetic anisotropy with an invariable magnetization direction;
   forming a tunnel barrier layer atop the reference layer;
   forming, atop the tunnel barrier layer, a crystalline structural quality and magnetic anisotropy enhancement bilayer (CSMAE bilayer) comprising an impurity absorbing layer with an interim thickness;
   annealing the CSMAE bilayer for crystalline structural quality and magnetic anisotropy enhancement; and
   etching out a top portion of the device in process until the impurity absorbing layer is reduced to a desirable thickness, whereby an undesirable spin pumping effect associated with the interim thickness of the impurity absorbing layer is mitigated.

2. The method of claim 1 wherein forming the CSMAE bilayer comprises
   2a) forming the recording layer comprising:
      2a1) a number of ferromagnetic elements necessary for forming a magnetic anisotropy therein, ideally made by materials comprising Cobalt and Iron; plus
      2a2) a number of crystalline structural quality enhancement (CSQE) elements necessary for forming the recording layer for achieving improved yield;
   2b) forming the impurity absorbing layer with ability to absorb, while under an annealing environment, the CSQE elements migrated from the recording layer, whereby:
      2b1) enhancing the crystalline structural quality, hence fabrication yield, of a resulting magnetoresistive element; and
      2b2) enhancing the magnetic anisotropy of the recording layer whereby achieving a high MR ratio for the magnetoresistive element with a simultaneous reduction of an undesirable spin pumping effect.

3. The method of claim 2 wherein the CSQE elements comprises Boron, in form(s) including but not limited to one or more of CoFeB and a mixture of CoB and FeB, ideally with a ratio of Boron over a recording layer compound between 10% and 30%.

4. The method of claim 2 wherein the recording layer comprises one or more of recording sub-layers.

5. The method of claim 1 wherein the impurity absorbing layer comprises one or more impurity absorbing sub-layers with a first impurity absorbing sub-layer located atop the recording layer and each subsequent impurity absorbing sub-layer located atop its preceding impurity absorbing sub-layer.

6. The method of claim 5 wherein each subsequent impurity absorbing sub-layer comprises a metal having stronger bond iconicity with CSQE elements than the preceding impurity absorbing sub-layer.

7. The method of claim 5 wherein each impurity absorbing sub-layers comprises metals selected from a group consisting of: Ti, V, Ta, Nb, Hf, Zr, W, Mo, Cr, Mg, and Al.

8. The method of claim 5 wherein, after forming the impurity absorbing sub-layers, the interim thickness of each impurity absorbing sub-layer is in a range from about 10 Angstroms to about 100 Angstroms.

9. The method of claim 5 wherein forming the impurity absorbing sub-layers comprises:
   forming a first impurity absorbing sub-layer composed of Titanium atop the recording layer; and
   forming a second impurity absorbing sub-layer composed of Tantalum atop the first impurity absorbing sub-layer.

10. The method of claim 5 wherein forming the impurity absorbing sub-layers alternatively comprises:
    forming a first impurity absorbing sub-layer composed of Titanium atop the recording layer;
    forming a second impurity absorbing sub-layer composed of Tantalum atop the first impurity absorbing sub-layer; and
    forming a third impurity absorbing sub-layer composed of Hafnium atop the second impurity absorbing sub-layer.

11. The method of claim 1 wherein the tunnel barrier layer comprises at least one member of nonmagnetic metal oxide consisting of: MgO, ZnO, and MgZnO.

12. The method of claim 1 wherein annealing the CSMAE bilayer comprising a heating process at a temperature higher than 250 degrees Celsius.

13. The method of claim 1 further comprises, between the steps of forming the CSMAE bilayer and annealing the CSMAE bilayer:
forming a protective layer atop the CSMAE bilayer to protect its impurity absorbing layer by avoiding its direct contact with an annealing environment.

14. The method of claim 13 wherein the protective layer comprises a material selected from a group consisting of: Cu, Ru, Al, Rh, Ag, and Au.

15. The method of claim 1 wherein etching out a top portion of the device in process comprises:
performing one or more etching processes.

16. The method of claim 15 wherein the etching process comprises one or more of:
a reactive ion etching (RIE) process, preferably using one or more of CH3OH gas chemistry and a mixture of NH3 and CO gas chemistry; and
an ion bean etching (IBE) process.

17. The method of claim 1 further comprises, after the step of etching out a top portion of the device in process:
forming an upper contact layer, comprising a buffer layer and a photoresist layer, above a remaining CS MAE bilayer.

18. The method of claim 1 further comprises, when necessary after the step of etching out a top portion of the device in process, oxidizing a top surface of a remaining CSMAE bilayer for forming a thin film having an interfacial thermal stability and a function as a diffusion barrier, using an oxidizing agent, preferably comprising Argon and a gas selected from a group consisting of: natural oxygen, radical oxygen, and ionized oxygen.

19. The method of claim 1 wherein forming the reference layer comprises one or more of
forming a magnetic anisotropy and invariable magnetization in a direction perpendicular to a film surface of the reference layer; and
forming a magnetic anisotropy and invariable magnetization in a direction parallel to a film surface of the reference layer.

20. The method of claim 1 wherein forming the recording layer comprises one or more of
forming a magnetic anisotropy and variable magnetization in a direction perpendicular to a film surface of the reference layer; and
forming a magnetic anisotropy and variable magnetization in a direction parallel to a film surface of the reference layer.

* * * * *